US012628315B2

(12) United States Patent
Fu et al.

(10) Patent No.: US 12,628,315 B2
(45) Date of Patent: May 12, 2026

(54) ELASTIC MEMBER, HEAT DISSIPATING STRUCTURE, AND TERMINAL DEVICE

(71) Applicants:CHAMP TECH OPTICAL (FOSHAN) CORPORATION, Foshan (CN); Foxconn Technology Co., Ltd., New Taipei (TW)

(72) Inventors: Meng Fu, Foshan (CN); Sheng-Hua Qin, Foshan (CN)

(73) Assignees: CHAMP TECH OPTICAL (FOSHAN) CORPORATION, Foshan (CN); Foxconn Technology Co., Ltd., New Taipei (TW)

( * ) Notice: Subject to any disclaimer, the term of this patent is extended or adjusted under 35 U.S.C. 154(b) by 185 days.

(21) Appl. No.: 18/428,194

(22) Filed: Jan. 31, 2024

(65) Prior Publication Data

US 2025/0133702 A1 Apr. 24, 2025

(30) Foreign Application Priority Data

Oct. 24, 2023 (CN) .......................... 202311386856.2

(51) Int. Cl.
*H05K 7/20* (2006.01)
*H01L 23/40* (2006.01)
*G02B 6/42* (2006.01)

(52) U.S. Cl.
CPC ......... *H05K 7/20418* (2013.01); *H01L 23/40* (2013.01); *G02B 6/4219* (2013.01); *G02B 6/4261* (2013.01); *G02B 6/4269* (2013.01)

(58) Field of Classification Search
None
See application file for complete search history.

(56) References Cited

U.S. PATENT DOCUMENTS

| | | | | |
|---|---|---|---|---|
| 5,241,453 A * | 8/1993 | Bright | .................. | H05K 7/1084 174/351 |
| 5,448,449 A * | 9/1995 | Bright | .................. | H05K 7/1084 174/16.3 |
| 5,678,627 A * | 10/1997 | Lee | ........................ | H01L 23/467 174/16.3 |
| 6,768,641 B2 * | 7/2004 | Li | .......................... | H01L 23/467 24/457 |
| 6,822,869 B2 * | 11/2004 | Huang | ................ | H01L 23/4093 165/185 |
| 7,180,744 B2 * | 2/2007 | Chen | .................... | H01L 23/4093 257/718 |
| 7,233,496 B2 * | 6/2007 | Lee | ..................... | H01L 23/4093 361/720 |

(Continued)

*Primary Examiner* — Courtney L Smith
(74) *Attorney, Agent, or Firm* — ScienBiziP, P.C.

(57) ABSTRACT

An elastic member can connect a first component to a second component. The elastic member includes at least one curved portion, at least one inserting portion, at least one connecting portion, and at least one abutting portion. The curved portion can be clamped in a first slot of the first component. The inserting portion can be clamped in a second slot of the second component. The connecting portion connects the curved portion to the inserting portion. The abutting portion connects the inserting portion and can abut against a surface of the second component. The abutting portion can deform toward the connecting portion. The present disclosure further provides a heat dissipating structure and a terminal device.

16 Claims, 8 Drawing Sheets

(56)            References Cited

U.S. PATENT DOCUMENTS

|  |  |  |  |
|---|---|---|---|
| 7,515,419 B2 * | 4/2009 | Li ........................ | H01L 23/4093 |
|  |  |  | 361/709 |
| 7,948,756 B2 * | 5/2011 | Du ...................... | H01L 23/4093 |
|  |  |  | 174/16.3 |
| 8,125,782 B2 * | 2/2012 | Azar ................... | H01L 23/4093 |
|  |  |  | 361/717 |
| 9,942,999 B2 * | 4/2018 | Hsu ..................... | H01L 23/4093 |
| 12,055,353 B2 * | 8/2024 | Jiwang ...................... | F28F 1/12 |
| 2003/0214787 A1 * | 11/2003 | Liu .................... | H01L 23/4006 |
|  |  |  | 248/510 |

* cited by examiner

100

100

30

ELASTIC MEMBER, HEAT DISSIPATING STRUCTURE, AND TERMINAL DEVICE

FIELD

The subject matter herein generally relates to circuit boards, and more particularly, to an elastic member, a heat dissipating structure, and a terminal device.

BACKGROUND

A heat dissipating plate is installed in a heat dissipating structure to dissipate heat generated by an electronic element in the heat dissipating structure. However, a connection between the heat dissipating plate and the electronic element may be insufficient, which affects the heat dissipation efficiency. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
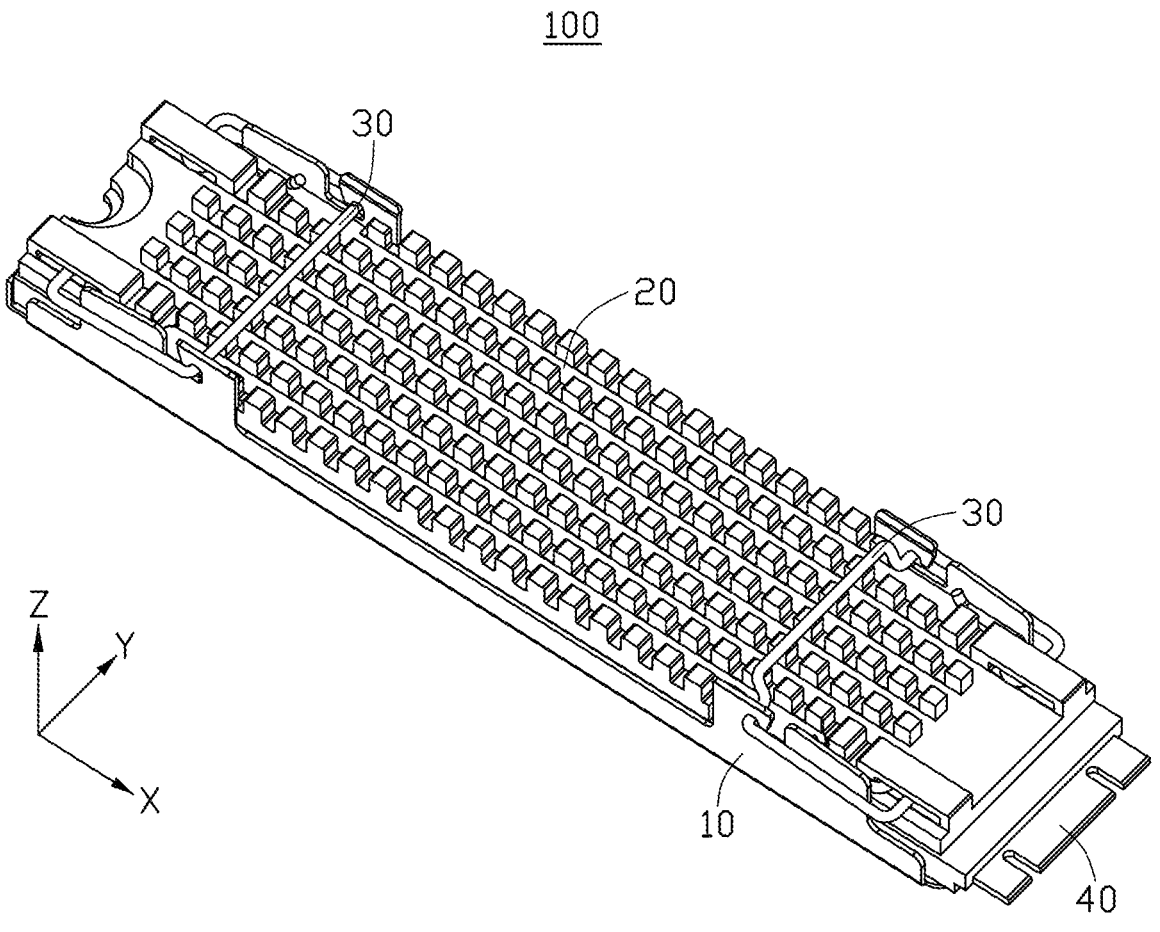
FIG. 1 is a diagrammatic view of an embodiment of a heat dissipating structure according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 2:
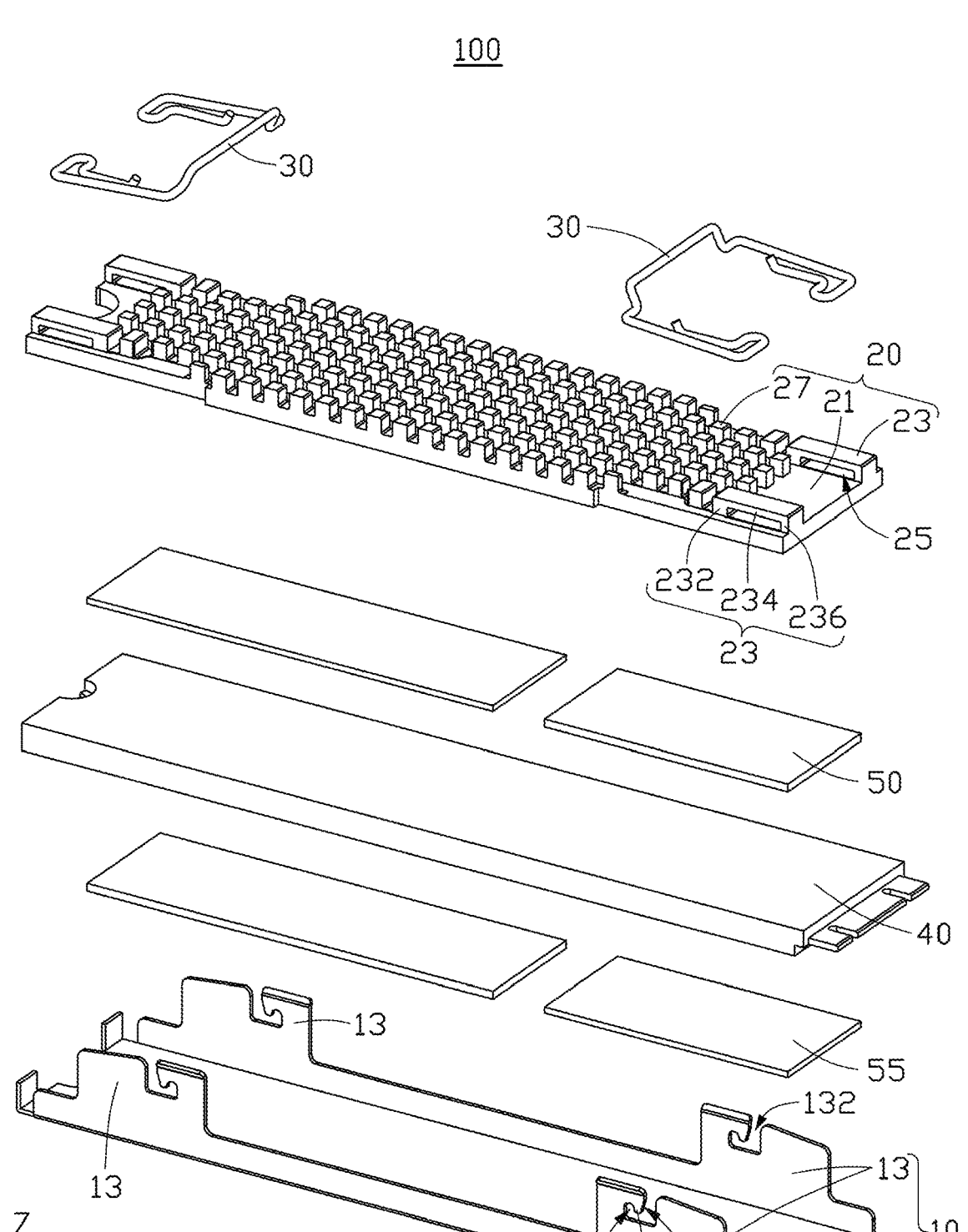
FIG. 2 is an exploded view of the heat dissipating structure of FIG. 1.

Referring to FIGS. 1 and 2, a heat dissipating structure 100 is provided according to an embodiment of the present disclosure. The heat dissipating structure 100 includes a bracket 10, a heat dissipating plate 20, an electronic element 40, and at least one elastic member 30. The electronic element 40 is disposed between the bracket 10 and the heat dissipating plate 20. The bracket 10 is fixed on the heat dissipating plate 20 through the elastic member 30, so that the bracket 10, the heat dissipating plate 20, the electronic element 40, and the elastic member 30 are connected as a whole.

The electronic element 40 is an element that generates heat during operation, for example, the electronic element 40 may be a hard disk, a chip, etc. In the embodiment, the electronic element 40 is a hard disk. The heat dissipating structure 100 can further include at least one of a first thermal conductive sheet 50 and a second thermal conductive sheet 55. The first thermal conductive sheet 50 can be disposed between the electronic element 40 and the heat dissipating plate 20, and the second thermal conductive sheet 55 can be disposed between the electronic element 40 and the bracket 10. The first thermal conductive sheet 50 and the second thermal conductive sheet 55 can bond to components adjacent to the electronic element 40 and transfer heat.

The bracket 10 (that is, a first component) includes a bottom plate 11 and at least two side plates 13. The side plates 13 surround the bottom plate 11, and are disposed on a same surface of the bottom plate 11. The side plates 13 can be spaced from each other. The side plates 13 and the bottom plate 11 cooperatively form an accommodating space 15. The electronic element 40, the heat dissipating plate 20, the first thermal conductive sheet 50, and the second thermal conductive sheet 55 are accommodated in the accommodating space 15. In the embodiment, the bracket 10 includes four side plates 13, and the four side plates 13 are symmetrically disposed on opposite sides of the bottom plate 11. A first slot 132 is defined on each side plate 13.

The plane defined by the bottom plate 11 is parallel to an X axis and an Y axis. Each side plate 13 extends along an Z axis. The X axis, the Y axis, and the Z axis can be perpendicular to each other, and the four side plates 13 are symmetrically disposed on both sides of the bottom plate 11 along the X axis. In other embodiments, the X axis, the Y axis, and the Z axis may not perpendicular to each other.

The first slot 132 extends through the side plate 13 along the Y axis. Each first slot 132 includes an opening area 1322 and a clamping area 1324. The opening area 1322 and the clamping area 1324 communicate with each other. The opening area 1322 and the clamping area 1324 as a whole are substantially L-shaped. The opening area 1322 is defined on a side of the side plate 13 away from the bottom plate 11, and the clamping area 1324 is defined on a side of the opening area 1322 close to the bottom plate 11.

Each side plate 13 further includes a hook 134, which is disposed between the opening area 1322 and the clamping area 1324 to partially separate the opening area 1322 from the clamping area 1324. The hook 134 can limit a position of the elastic member 30.

The heat dissipating plate 20 (that, is a second component) includes a body 21 and at least two protruding portions 23, and the number of the protruding portions 23 is the same as the number of the side plates 13. The body 21 is substantially parallel to the bottom plate 11, and the protruding portions 23 protrude from a surface of the body 21 along the Z axis. A portion of each protruding portion 23 is spaced apart from the body 21 to form a second slot 25, and the second slot 25 penetrates the heat dissipating plate 20 along the Y axis. In other embodiments, the second slot 25 may not penetrate the heat dissipating plate 20 and can be recessed along the Y axis. The second slot 25 is elongated and can be used as a chute. The elastic member 30 can be received in the first slot 132 and the second slot 25 at the same time, thereby fixing the heat dissipating plate 20 to the bracket 10.

In the embodiment, each protruding portion 23 includes a first blocking section 232, a connecting section 234, and a second blocking section 236. The connecting section 234 connects to the first blocking section 232 and the second blocking section 236. The first blocking section 232 and the second blocking section 236 are disposed at both ends of the connecting section 234 along the X axis. The first blocking section 232 and the second blocking section 236 are both connected to the body 21, and the connecting section 234 and the body 21 are spaced apart from each other to form the second slot 25. The first blocking section 232 is disposed inwardly relative to the second blocking section 236.

The surface of the body 21 having the protruding portions 23 is further provided with a plurality of heat dissipating portions 27, and the heat dissipating portions 27 can dissipate heat.

Figure 3:
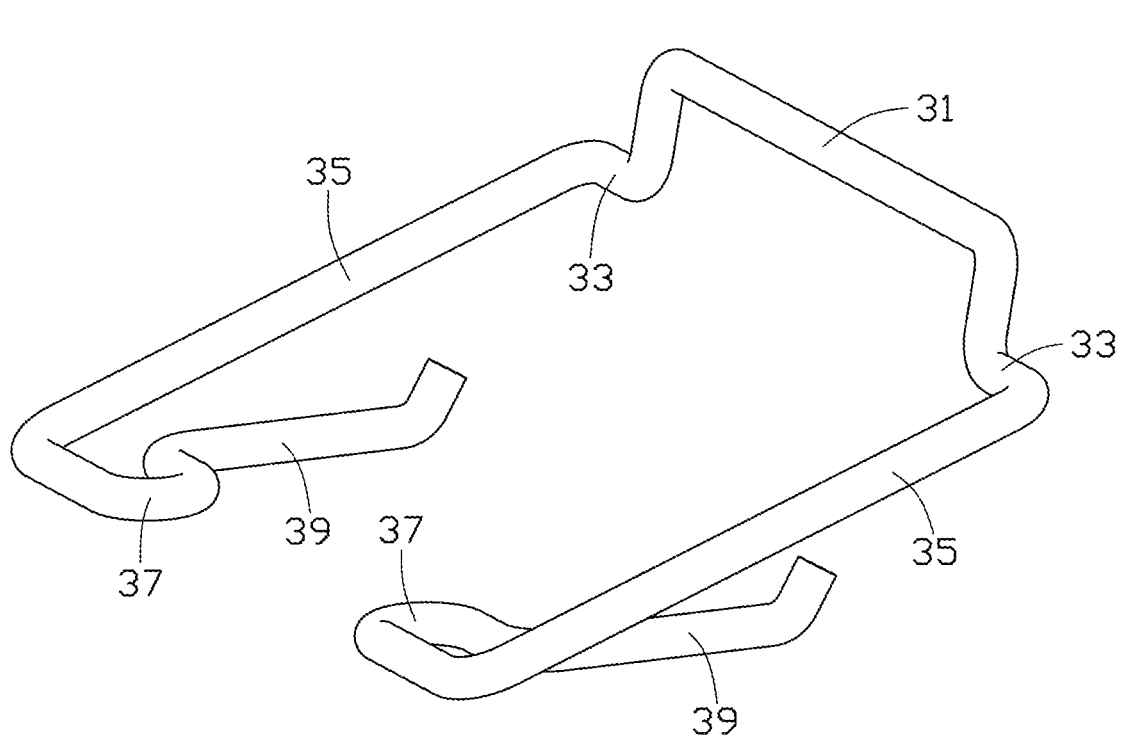
FIG. 3 is an enlarged view of an elastic member of the heat dissipating structure of FIG. 2.

Referring to FIG. 3, the elastic member 30 can be an integral structure. On one hand, the elastic member 30 is assembled on the heat dissipating plate 20 and the bracket 10. On the other hand, the elastic member 30 can be deformed after being assembled on the heat dissipating plate 20 and the bracket 10, thus providing installation tolerance for the assembly of the bracket 10, the heat dissipating plate 20, the electronic element 40, and the elastic member 30.

Each elastic member 30 includes a handle portion 31, two curved portions 33, two connecting portions 35, two inserting portions 37, and two abutting portions 39. The two curved portions 33 are disposed at both ends of the handle portion 31. Each connecting portion 35 connects to one curved portion 33 and one inserting portion 37, and the abutting portion 39 connects to the inserting portion 37 and extends to the handle portion 31.

The handle portion 31 protrudes from the curved portions 33, and a space is formed between the handle portion 31 and each curved portion 33. The handle portion 31 is substantially C-shaped and is used for users to hold the elastic member 30. After the elastic member 30 is assembled in the heat dissipating structure 100, the handle portion 31 is disposed between the two side plates 13. The handle portion 31 is spaced from the heat dissipating plate 20 to facilitate the assembly and disassembly of the elastic member 30.

The curved portions 33 are disposed at the two ends of the handle portion 31 and extend outward relative to the handle portion 31. Each curved portion 33 can penetrate one first slot 132 along the Y axis and then be clamped in the first slot 132.

Each connecting portion 35 is substantially perpendicular to the corresponding curved portion 33, and each connecting portion 35 is disposed on a side of the corresponding side plate 13 away from the heat dissipating plate 20.

One inserting portion 37 and one curved portion 33 connected to the same connection portion 35 both protrude inward relative to the connection portion 35, and the inserting portion 37 can be accommodated in the second slot 25. That is, each elastic member 30 can be clamped in two first slots 132 and two second slots 25. Each inserting portion 37 is bent, for example, each inserting portion 37 is substantially U-shaped or V-shaped, so that the inserting portion 37 can be deformed. When the curved portions 33 are clamped in the first slot 132 and the inserting portion 37 is accommodated in the second slot 25, the inserting portion 37 can abut against the protruding portions 23 and then compressed. When two elastic members 30 are included, the two elastic members 30 are in opposition and stretched from each other along the X axis, so that the bracket 10 and the heat dissipating plate 20 are fixed along the X axis.

The inserting portion 37 connects to the connecting portion 35 and the abutting portion 39. The abutting portion 39 extends towards the curved portions 33. The abutting portion 39 can be deformed toward the connecting portions 35 to press against a surface of the body 21. The curved portion 33 and the inserting portion 37 disposed on the same side of the handle portion 31 can limit the positions of the bracket 10 and the heat dissipating plate 20 along the X axis. The curved portion 33 and the inserting portion 37 disposed on both sides of the handle portion 31 can limit the positions of the bracket 10 and the heat dissipating plate 20 along the Y axis. The elastic action between the abutting portion 39 and the connecting portion 35 can limit the positions of the bracket 10 and the heat dissipating plate 20 along the Z axis, thereby fixing the bracket 10 and the heat dissipating plate 20 together.

Figure 4:
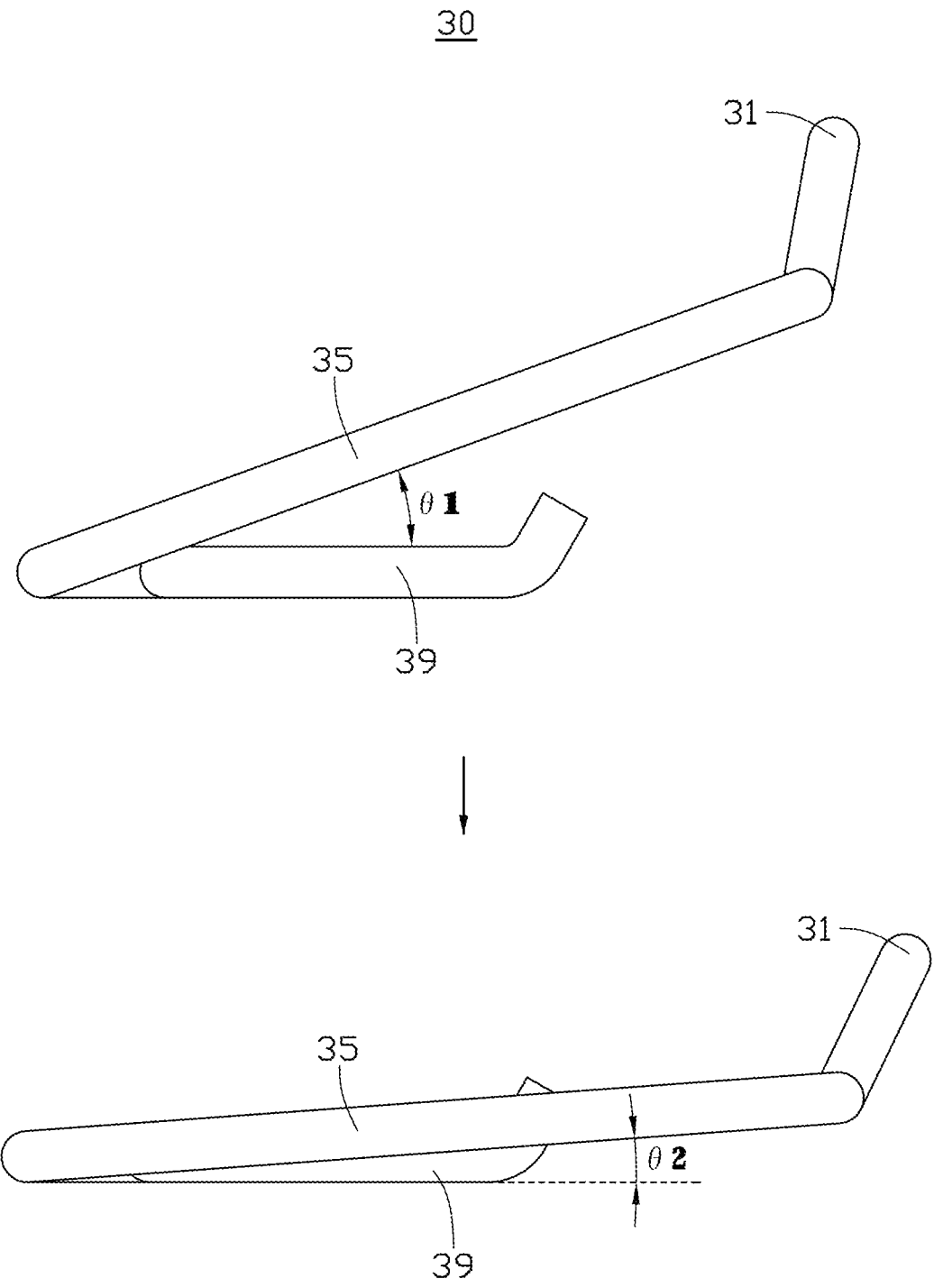
FIG. 4 is a side view showing the elastic member of FIG. 2 before and after being installed in the heat dissipating structure.

Referring to FIG. 4, before the elastic member 30 is assembled into the heat dissipating structure 100, a first angle $\theta1$ is defined between the connecting portion 35 and the abutting portion 39. After the elastic member 30 is assembled into the heat dissipating structure 100, a second angle $\theta2$ is defined between the connecting portion 35 and the abutting portion 39. The first angle $\theta1$ is greater than the second angle $\theta2$. After the elastic member 30 is assembled into the heat dissipating structure 100, the side plates 13 can be disposed between the abutting portion 39 and the connecting portion 35, and the abutting portion 39 is abutted against the body 21 to limit the positions of the bracket 10 and the heat dissipating plate 20 along the Z axis. A length of the abutting portion 39 and a size of the first angle $\theta1$ can affect a force of the elastic member 30 applied to the bracket 10 and the heat dissipating plate 20 along the Z axis.

After the elastic member 30 is assembled in the heat dissipating structure 100, the end of the abutting portion 39 away from the inserting portion 37 raises in the direction away from the body 21, so that when installing the elastic member 30, the abutting portion 39 comes into contact with the heat dissipating plate 20 through an arc surface, reducing a frictional resistance during relative sliding and preventing scratching of the heat dissipating plate 20.

Figure 5:
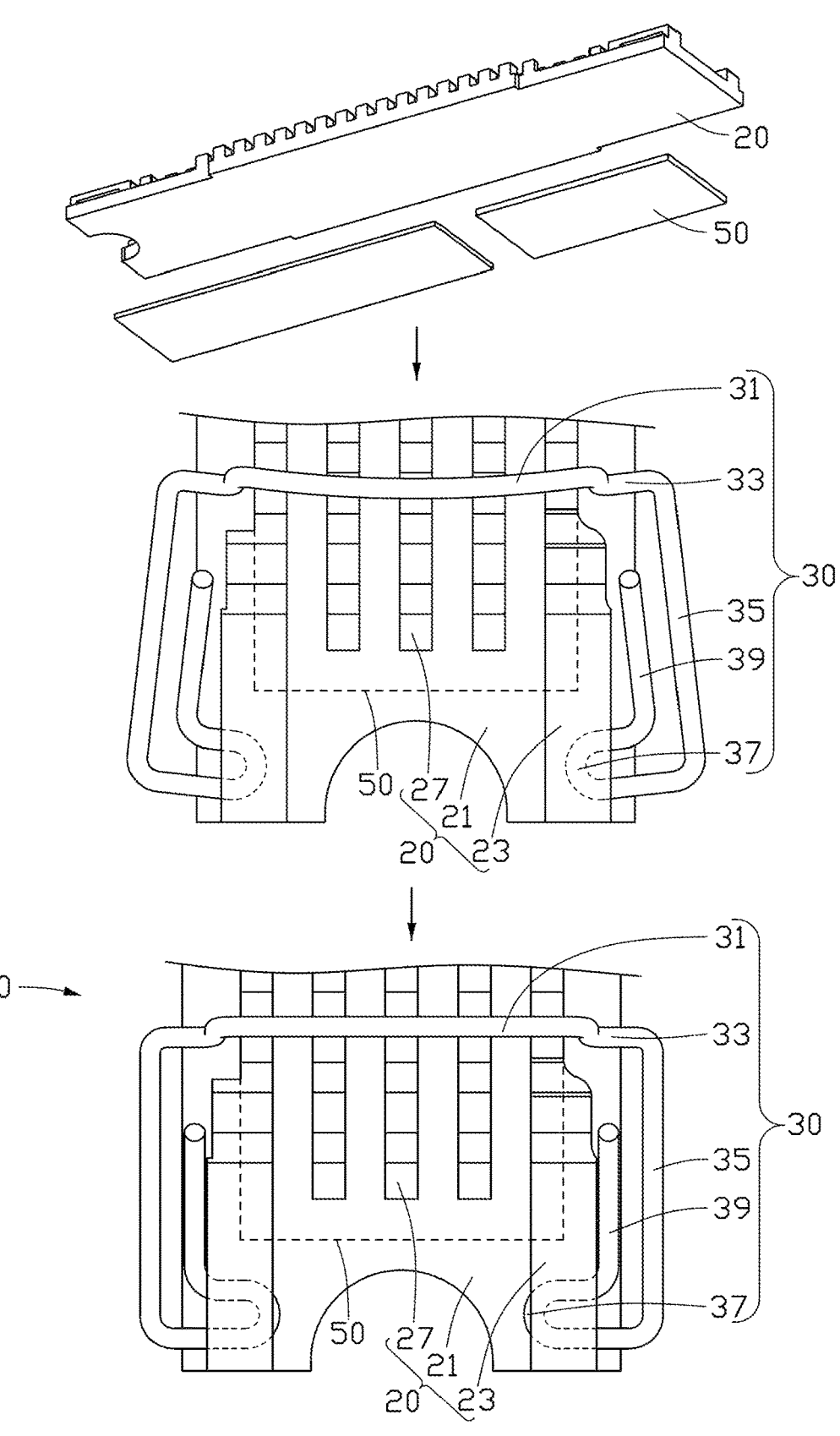
FIG. 5 is a diagrammatic view showing a first thermal conductive sheet, a heat dissipating plate, and the elastic member assembled to form a first component according to an embodiment of the present disclosure.
Figure 6:
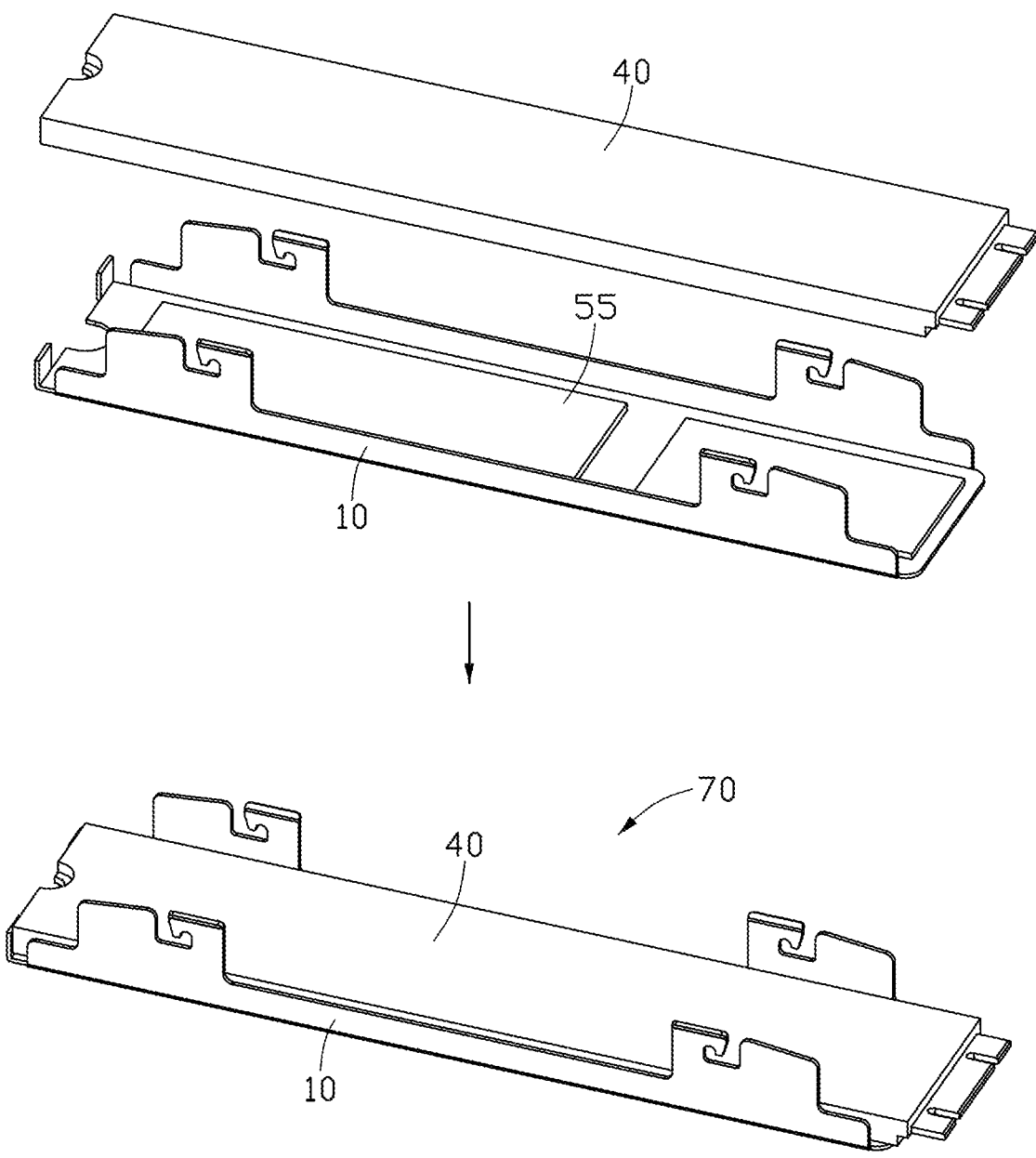
FIG. 6 is a diagrammatic view showing a second thermal conductive sheet, a bracket, and an electronic element assembled to form a second component according to an embodiment of the present disclosure.
Figure 7:
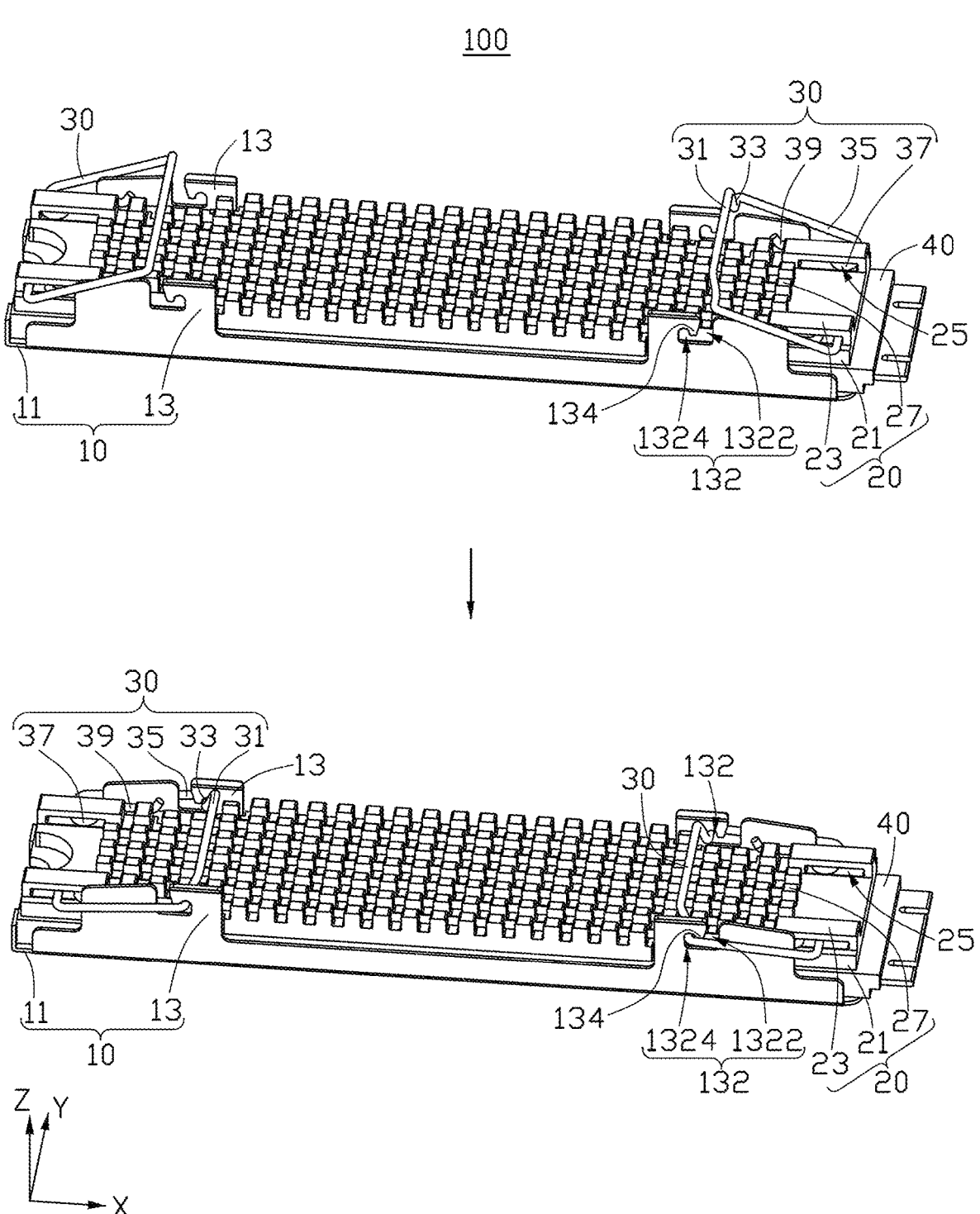
FIG. 7 is a diagrammatic view of the first component of FIG. 5 and the second component of FIG. 6 assembled to form the heat dissipating structure according to an embodiment of the present disclosure.

Referring to FIGS. 5, 6, and 7, the following describes in detail an installation process of the heat dissipating structure 100 provided by the embodiment.

Referring to FIG. 5, the first thermal conductive sheet 50 is attached to a surface of the heat dissipating plate 20. The first thermal conductive sheet 50 is attached to a surface of the body 21 away from the heat dissipating portions 27. The two connecting portions 35 of the elastic member 30 can extend away from the handle portion 31, and the two inserting portions 37 are inserted into the corresponding second slot 25 of the heat dissipating plate 20, a first assembly 60 is obtained.

Referring to FIG. 6, the second thermal conductive sheet 55 is attached to a surface of the bracket 10. The second thermal conductive sheet 55 is attached to a surface of the bottom plate 11 with the side plates 13. The electronic element 40 is disposed in the bracket 10 and bonded to the second thermal conductive sheet 55. Then, a second assembly 70 is obtained.

Referring to FIG. 7, the first assembly 60 and the second assembly 70 are assembled. The first assembly 60 is placed on a side of the second assembly 70 where the electronic element 40 is disposed. The elastic member 30 is disposed on the side of the heat dissipating plate 20 away from the second assembly 70. The side plates 13 are disposed between the connecting portion 35 and the abutting portion 39, and the abutting portion 39 is disposed on the surface of the body 21. The connecting portion 35 and the handle portion 31 raise relative to the body 21. The inserting portions 37 abut against the second blocking section 236, the handle portion 31 is pressed downward along the Z axis towards the body 21, and the curved portions 33 move through the opening area 1322 of the first slot 132 along the X axis toward the clamping area 1324, thereby driving the elastic member 30 to move along the X axis as a whole. The inserting portions 37 can then move towards the first blocking section 232 in the second slot 25. During the movement process, the abutting portion 39 keeps resisting against and sliding on the surface of the body 21. When the force applied to the elastic member 30 is removed, the curved portions 33 move along the Z axis under the action of its own elastic force and resist against the side plates 13. The hook 134 can limit the movement of the curved portions 33 along the X axis.

The process of assembling the heat dissipating structure 100 is simple without a riveting process, allowing the multiple components of the heat dissipating structure 100 to be fixed together. The interaction between the elastic member 30, the bracket 10, and the heat dissipating plate 20 can limit the movement in multiple directions, allowing the bracket 10, the heat dissipating plate 20, the electronic element 40, and the elastic member 30 to be connected into a whole. The second slot 25 of the heat dissipating plate 20 reserves a movable space for the elastic member 30 along the Z axis, and the elastic member 30 can move along the Z axis under the action of its own elasticity. The curved portions 33 and the inserting portions 37 disposed on both sides of the handle portion 31 can limit the positions of the bracket 10 and the heat dissipating plate 20 along the Y axis. When the electronic element 40 moves along the X axis under an external force, the inserting portions 37 can slide relative to the heat dissipation plate 20 in the second slot 25, and the heat dissipating plate 20 can move synchronously along the X axis relative to the electronic element 40, allowing the bracket 10 and the heat dissipating plate 20 to remain closely connected to the electronic element 40, thereby ensuring the structural stability and heat dissipation performance of the heat dissipating structure 100 under installation, transportation, and working conditions.

Figure 8:
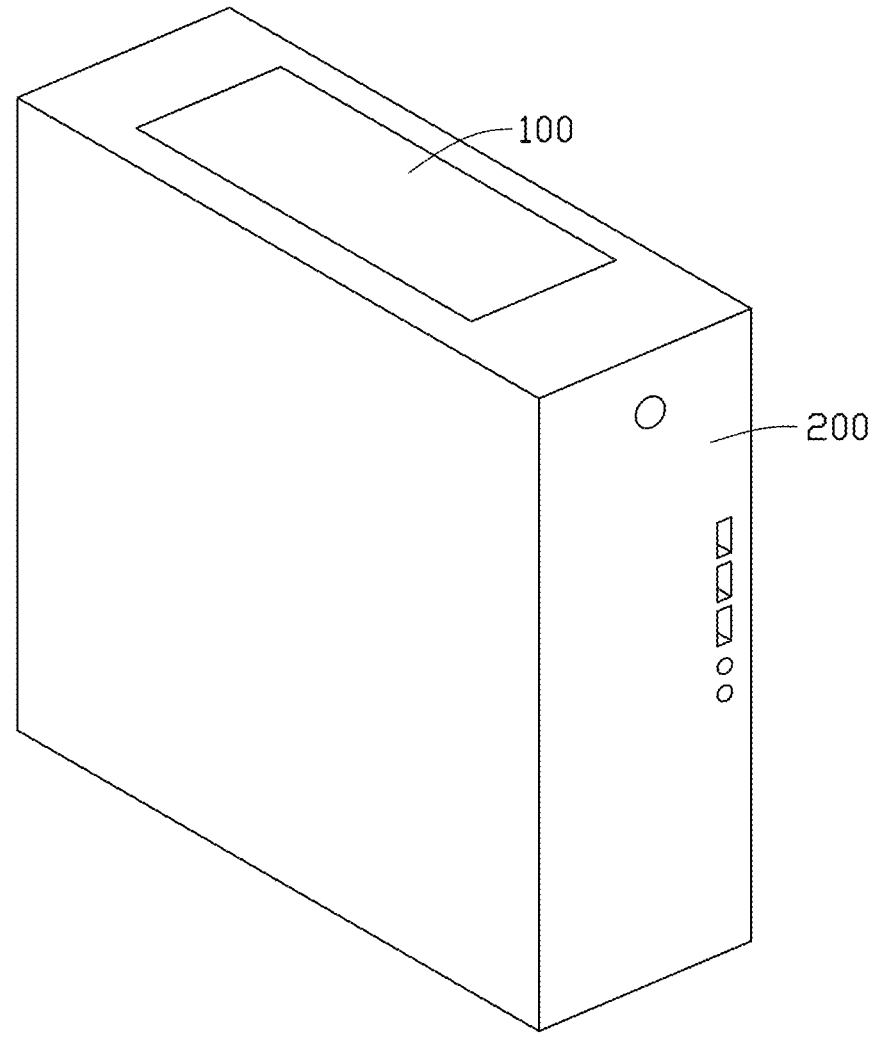
FIG. 8 is a diagrammatic view of an embodiment of a terminal device according to an embodiment of the present disclosure.

Referring to FIG. 8, a terminal device 200 including the heat dissipating structure 100 is further provided in an embodiment of the present application. The terminal device 200 can be a desktop computer, a laptop computer, a server, etc. In the embodiment, the terminal device 200 is a desktop computer, and the heat dissipating structure 100 is disposed in a chassis of the desktop computer.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A heat dissipating structure comprising:
a bracket comprising a bottom plate and at least two side plates, the at least two side plates surrounding the bottom plate to form an accommodating space, each of the at least two side plates defining a first slot;
an electronic element accommodated in the accommodating space;
a heat dissipating plate defining a plurality of second slots, the electronic element disposed between the heat dissipating plate and the bracket; and
at least one elastic member each comprising two curved portions, two inserting portions, two connecting portions, two abutting portions, and a handle portion, the two curved portions connecting to two ends of the handle portion, each of the two connecting portions connecting to a corresponding one of the two curved portions, each of the two abutting portions connecting to a corresponding one of the two inserting portions and extending toward the handle portion,
wherein the at least one elastic member is configured to connect the bracket to the heat dissipating plate, the handle portion is disposed between two adjacent of the at least two side plates, each of the two curved portions is clamped in the first slot, each of the two inserting portions is clamped in a corresponding one of plurality of second slots, each of the two connecting portions is disposed a side of the at least two side plates away from the electronic element, and each of the two abutting portions abuts against a surface of the heat dissipating plate.

2. The heat dissipating structure of claim 1, wherein before the at least one elastic member connects the bracket to the heat dissipating plate, a first angle is defined between each of the two connecting portions and a corresponding one of the two abutting portions; after the at least one elastic member connects the bracket to the heat dissipating plate, a second angle is defined between each of the two connecting portions and the corresponding one of the two abutting portions; the first angle is greater than the second angle.

3. The heat dissipating structure of claim 1, wherein the first slot comprises an opening area and a clamping area communicating with the opening area, the opening area is defined on a side of a corresponding one of the at least two side plates away from the bottom plate, the clamping area is defined on a side of the opening area close to the bottom plate, each of the two curved portions moves through the opening area toward the clamping area as the at least one elastic member connecting the bracket to the heat dissipating plate.

4. The heat dissipating structure of claim 3, wherein each of the at least two side plates further comprises a hook, the hook is disposed between the clamping area and the opening area, and the hook is configured to partially separate the opening area from the clamping area.

5. The heat dissipating structure of claim 3, wherein each of the two connecting portions is configured to extend away from the handle portion, and each of the two inserting portions is configured to be inserted into a respective one of the plurality of second slots.

6. The heat dissipating structure of claim 1, wherein the heat dissipating plate further comprises a body and at least two protruding portions, a portion of each of the at least two protruding portions is spaced apart from the body to form a corresponding one of the at least two second slots, each of the two inserting portions slides into the corresponding one of the at least two second slots as the at least one elastic member connecting the bracket to the heat dissipating plate.

7. The heat dissipating structure of claim 6, wherein an end of each of the two abutting portions away from the corresponding one of the two inserting portions raises in a direction away from the body.

8. The heat dissipating structure of claim 1, wherein each of at least two side plates is disposed between a corresponding one of the two connecting portions and a corresponding one of the two inserting portions.

9. A terminal device comprising
a heat dissipating structure comprising:
a bracket comprising a bottom plate and at least two side plates, the at least two side plates surrounding the bottom plate to form an accommodating space, each of the at least two side plates defining a first slot;
an electronic element accommodated in the accommodating space;
a heat dissipating plate defining a plurality of second slots, the electronic element disposed between the heat dissipating plate and the bracket; and
at least one elastic member each comprising two curved portions, two inserting portions, two connecting portions, two abutting portions, and a handle portion, the two curved portions connecting to two ends of the handle portion, each of the two connecting portions connecting to a corresponding one of the two curved portions, each of the two abutting portions connecting to a corresponding one of the two inserting portions and extending toward the handle portion;
wherein the at least one elastic member is configured to connect the bracket to the heat dissipating plate, the handle portion is disposed between two adjacent of the at least two side plates, each of the two curved portions is clamped in the first slot, each of the two inserting portions is clamped in a corresponding one of plurality of second slots, each of the two connecting portions is disposed a side of the at least two side plates away from the electronic element, and each of the two abutting portions abuts against a surface of the heat dissipating plate.

10. The terminal device of claim 9, wherein before the at least one elastic member connects the bracket to the heat dissipating plate, a first angle is defined between each of the two connecting portions and a corresponding one of the two abutting portions; after the at least one elastic member connects the bracket to the heat dissipating plate, a second angle is defined between each of the two connecting portions and the corresponding one of the two abutting portions; the first angle is greater than the second angle.

11. The terminal device of claim 9, wherein the first slot comprises an opening area and a clamping area communicating with the opening area, the opening area is defined on a side of a corresponding one of the at least two side plates away from the bottom plate, the clamping area is defined on a side of the opening area close to the bottom plate, each of the two curved portions moves through the opening area toward the clamping area as the at least one elastic member connecting the bracket to the heat dissipating plate.

12. The terminal device of claim 11, wherein each of the at least two side plates further comprises a hook, the hook is disposed between the clamping area and the opening area, and the hook is configured to partially separate the opening area from the clamping area.

13. The terminal device of claim 11, wherein each of the two connecting portions is configured to extend away from the handle portion, and each of the two inserting portions is configured to be inserted into a respective one of the plurality of second slots.

14. The terminal device of claim 9, wherein the heat dissipating plate further comprises a body and at least two protruding portions, a portion of each of the at least two protruding portions is spaced apart from the body to form a corresponding one of the at least two second slots, each of the two inserting portions slides into the corresponding one of the at least two second slots as the at least one elastic member connecting the bracket to the heat dissipating plate.

15. The terminal device of claim 14, wherein an end of each of the two abutting portions away from the corresponding one of the two inserting portions raises in a direction away from the body.

16. The terminal device of claim 9, wherein each of at least two side plates is disposed between a corresponding one of the two connecting portions and a corresponding one of the two inserting portions.

* * * * *